United States Patent [19]

Lakios et al.

[11] Patent Number: 4,949,783
[45] Date of Patent: Aug. 21, 1990

[54] SUBSTRATE TRANSPORT AND COOLING APPARATUS AND METHOD FOR SAME
[75] Inventors: Emmanuel N. Lakios, Port Jefferson Station; Michael F. McGraw, East Setauket, both of N.Y.
[73] Assignee: Veeco Instruments, Inc., Melville, N.Y.
[21] Appl. No.: 195,707
[22] Filed: May 18, 1988
[51] Int. Cl.$^5$ .......................... F28F 13/02; C23C 14/50
[52] U.S. Cl. ................................... 165/80.1; 29/25.01; 118/69; 118/724
[58] Field of Search ........................... 165/1, 46, 80.1; 29/569.1; 118/69, 724, 728

[56] References Cited

U.S. PATENT DOCUMENTS

| | | |
|---|---|---|
| 3,566,960 | 3/1971 | Stuart . |
| 3,818,982 | 6/1974 | Wagner . |
| 3,993,123 | 11/1976 | Chu et al. . |
| 4,072,188 | 2/1978 | Wilson et al. ........................ 165/80 |
| 4,139,051 | 2/1979 | Jones et al. . |
| 4,194,233 | 3/1980 | Jones et al. . |
| 4,261,762 | 4/1981 | King . |
| 4,282,924 | 8/1981 | Faretra . |
| 4,457,359 | 7/1984 | Holden . |
| 4,508,161 | 4/1985 | Holden .................................. 165/1 |
| 4,542,298 | 9/1985 | Holden . |
| 4,567,938 | 2/1986 | Turner ................................. 165/1 |
| 4,603,466 | 8/1986 | Morley ............................... 29/569.1 |
| 4,680,061 | 7/1987 | Lamont, Jr. . |
| 4,682,566 | 7/1987 | Aitken ................................ 118/724 |

OTHER PUBLICATIONS

Hammer, W. N., "Cooling Ion Implantation Target", vol. 19, No. 6, pp. 2270-2271, (1976).
Dushman, S., "Scientific Foundations of Vacuum Technique", Sec. Ed., pp. 42-49, 1962.
Schaaf, A. F., "Developments in Heat Transfer," The M.I.T. Press, pp. 134-168, 1964.
White, G. K., "Experimental Techniques in Low-Temperature Physics", pp. 179-183, 1959.
Cuomo, J. J., "Heat Transfer Process for High Thermal Input Process", vol. 21, pp. 840-841, Jul., 1978.
Hartnett, J. P., "A Survey of Thermal Accommodation Coefficients", Second International Symposium on Rarefied Gas Dynamics 1961, Sec. 1, pp. 1-28.
King, M., "Experiments on Gas Cooling of Wafers", Nuclear Instruments and Methods 189 (1981), pp. 169-172.
Sieradzki, M., "Air-Enhanced Contact Cooling of Wafers", Nuclear Instruments and Methods in Physics Research B6, pp. 237-242.

Primary Examiner—Martin P. Schwadron
Assistant Examiner—Allen J. Flanigan
Attorney, Agent, or Firm—Morgan & Finnegan

[57] ABSTRACT

A loading station receives a substrate into a load-lock volume pressure isolated from a loading station chamber which is open to a processing chamber. The volume is evacuated and the substrate lowered into the loading chamber. A transport arm moves the substrate from the loading station to a substrate carrier of a cooling fixture within the processing chamber. The carrier is connected to a clamp which together move vertically downward to lower the wafer onto a substrate seat of the fixture. During substrate processing the fixture is tiltable and rotatable and provides substrate cooling by solid-to-solid conduction, forced convection and free convection.

Solid-to-solid conduction is provided by the clamp. The substrate is pressed to the fixture by the cooling clamp having a circulating cooling fluid.

Forced convection is provided by a gas flowing into the microscopic areas between the substrate and the fixture at a pressure high enough to cause bowing or lifting of the substrate and thus to create a gas region between the substrate and the fixture. An O-ring provides a seal under the pressure of the clamps near the periphery of the substrate to substantially seal the gas from entering the processing chamber. The gas flows into and through the gas region absorbing heat energy from the back surface of the substrate and flowing out of the region.

Free convection is provided by heat transfer between the substrate and the substrate seat. The pressure in the gas region is high enough that the mean free path of the gas molecules is less then the distance between the substrate and the fixture. As a result gas molecules absorb energy from the substrate and intermix and transfer energy with other molecules. Some molecules collide with the substrate seat and transfer heat energy to the seat. After substrate treatment the gas is evacuated from behind the substrate prior to release of the clamps.

6 Claims, 6 Drawing Sheets

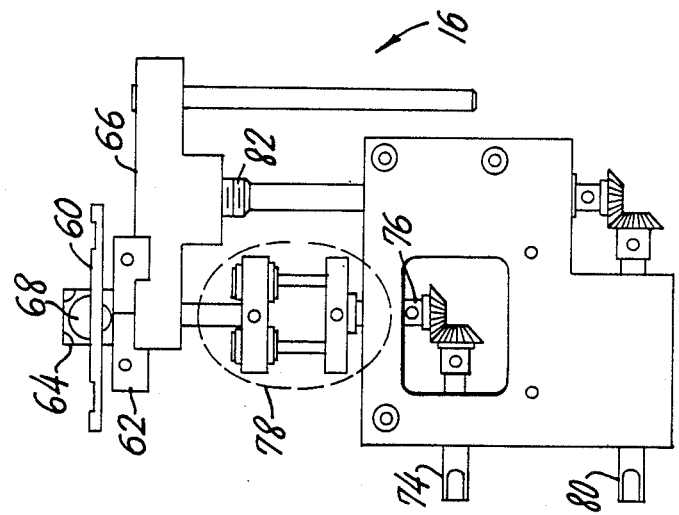
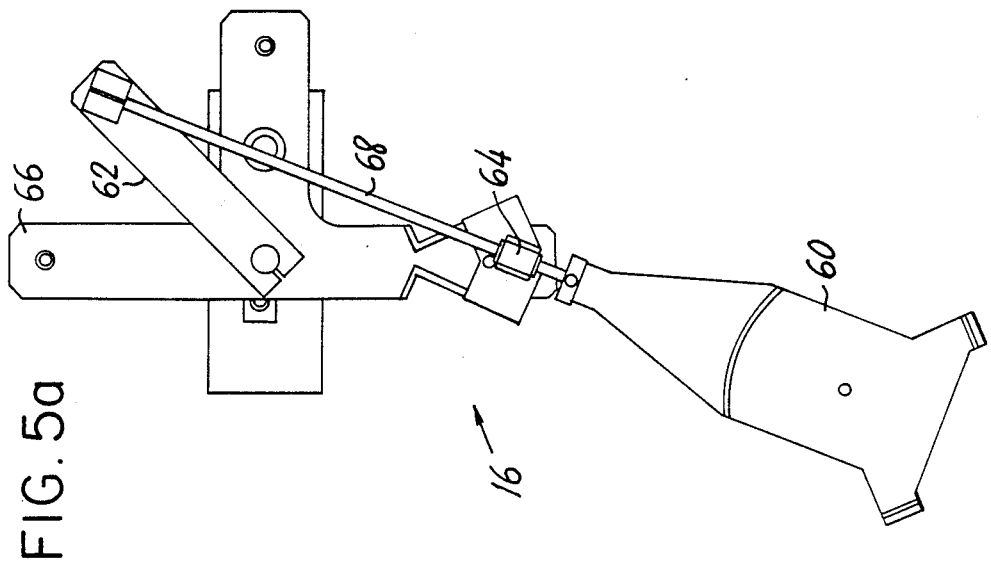

SUBSTRATE TRANSPORT AND COOLING APPARATUS AND METHOD FOR SAME

FIELD OF THE INVENTION

This invention relates to an apparatus and method for transporting and cooling a wafer-like substrate in a substrate treating system. More particularly, this invention relates to an apparatus and method for cooling a substrate by free and forced convection and for loading and unloading a substrate.

BACKGROUND OF THE INVENTION

Many substrate treatment processes involve exposing a substrate in a vacuum chamber to an ion beam, thereby causing the substrate to absorb heat. Because the substrate can only absorb a certain amount of heat or reach a certain temperature before being damaged, a common problem encountered is how to cool the wafer during treatment. Typical treatment processes require that substrate temperatures be maintained below 100° C. to be compatible with photoresist.

For treatment processes using pressures approaching atmospheric pressure, the density of gas atoms in the vicinity of the substrate is sufficient to absorb the heat from the substrate. As the pressure is reduced less heat can be removed via the gas in the treatment chamber. With Argon gas and a pressure of approximately $10^{-4}$ Torr, the mean free path of the Argon molecules is approximately the physical dimension of a typical process chamber (i.e. 150 cm). Under such conditions, the wafer can not be exposed to the ion beam for a significant period of time without being damaged.

With the pressure too low to provide effective substrate cooling in the treatment chamber, other heat transfer techniques are needed. At temperature approximating 100° C., the temperature is too low for effective radiation cooling. With wafer surfaces typically allowing no more than 15% of the surface area to make actual contact with a cooled support surface, solid-to-solid conduction also may be ineffective.

For substrate treatment processes using an ion beam, substrate cooling has been a significant problem. An early approach was to clamp the wafers to improve the percentage of contact between the back surface of the substrate and a substrate holder or cooled platen. An improvement on this was to place compliant thermally conductive materials between the substrate and the platen. Another method was to employ beam sharing techniques where substrates are moved in and out of the beam to reduce heat build-up. However, demands for increased processing throughput resulted in treatment processes requiring increased beam current and power densities. Such increased power densities prompted a need for better cooling technology. Additional demands also occurred for substrates having increased diameter and for equipment having fewer failures attributable to particle contamination.

In the ion beam etching field, cooling techniques progressed from grease to thermally conductive rubber pads and electrostatic hold down plates. These techniques have been effective for power densities approximating 500 mW/cm$^2$, but are operator intensive requiring careful attention to detail to achieve reliable results.

An improvement has been to use gas contained between the substrate and the cooled substrate support to enhance the solid-to-solid conduction with thermal conduction by molecular gas heat transfer. In thermal conduction, gas molecules in contact with the back surface of the substrate absorb heat then travel without collision to the cooled support and transfer a portion of the absorbed heat to the cooled support. A problem with such a contained gas is that the gas heats up over time and becomes ineffective for treatment processes of long duration such as ion beam etching processes.

To enable gas cooling to be effective for prolonged substrate treatment processes, it is an object of this invention to increase the gas pressure to increase the number of gas molecules and to decrease the mean free path of the molecules to a value less than the distance between the substrate and the support such that cooling is achieved by free convection.

It is another object of this invention to flow the gas into and through the space between the substrate and the cooled support to achieve heat transfer by forced convection.

It is another object of this invention to achieve reliable loading and unloading of a substrate from a reliable and modular substrate fixture while under substantially vacuum pressure conditions.

It is another object of this invention to provide a substrate cooling fixture which tilts and rotates during ion beam etching processes, acts as a heat sink for the substrate and is compatible with automatic substrate loading and unloading processes.

It is another object of this invention to achieve high throughput ion beam processing by providing a substrate cooling fixture and a load-locked vacuum chamber within a system for transporting a wafer between the fixture and the chamber.

It is another object of this invention to achieve low particular generation to improve the yield of fabricated substrates.

It is another object of this invention to provide a substrate loading station that is compatible with cassette to cassette operations.

It is another object of this invention to provide a system combatible with automatic material transport systems.

SUMMARY OF THE INVENTION

These and other objects of the invention are achieved by an apparatus and method for substrate cooling and an apparatus and method for substrate loading and unloading. A substrate cooling fixture supports the substrate and provides cooling of the substrate by: (i) solid-to-solid conduction between the substrate and the fixture, (ii) free convection heat transfer between the substrate and the fixture using a gas at pressures between approximately 10 Torr and 760 Torr (the pressure depending on the material and thickness of the substrate), (iii) forced convection heat transfer by flowing the gas into and through the space between the substrate and the fixture. The fixture surface adjacent to the substrate is black anodized for improving its heat absorption capabilities. The fixture and the clamp pressing the wafer to the fixture have channels within their structure for circulating a cooling liquid.

By clamping the substrate to the fixture and including an O-ring at the fixture surface near the periphery of the substrate a seal is formed. Gas enters the region between the substrate and the fixture within the area defined by the O-ring seal. As a result, the gas is substantially restricted from entering the processing chamber.

The gas is flowed through the region between the substrate and the fixture during processing and absorbs energy from the back surface of the wafer. The gas flow is forced causing gas to enter the region, flow behind the substrate, and exit. Such gas flow causes energy transfer by forced convection.

By using pressures of 10 Torr to 760 Torr, the gas pressure is high enough to cause bowing of the substrate and to cause the mean free path of the gas molecules to be less than the distance between the substrate and the cooling fixture. Due to the gas pressure and the viscosity of the gas heat transfer also occurs between the substrate back surface and the cooling fixture. Such heat transfer is by free convection.

The region at the periphery of the wafer outside the O-ring seal is cooled by solid-to-solid conduction between the wafer and a clamp containing a circulating cooling fluid.

The apparatus and method for loading and unloading the fixture involves transporting a substrate from approximately atmospheric pressure to substantially vacuum pressure and loading or unloading the substrate while under substantially vacuum pressure. The substrate enters or exits the system at a load station which houses a load-lock volume. The substrate enters at approximately atmospheric pressure, then the volume is evacuated and lowered into a vacuum chamber of the load station. A transport arm then transfers the substrate from the load station to the cooling fixture in the process chamber. The system includes apparatus for tilting and rotating the fixture during treatment processes such as ion beam etching.

BRIEF DESCRIPTION OF THE DRAWING

FIG. 5a is plan view of the substrate transfer mechanism.

FIG. 5b is a cross-sectional view of the substrate transfer mechanism.

DETAILED DESCRIPTION OF A PREFERRED EMBODIMENT

Figure 1:
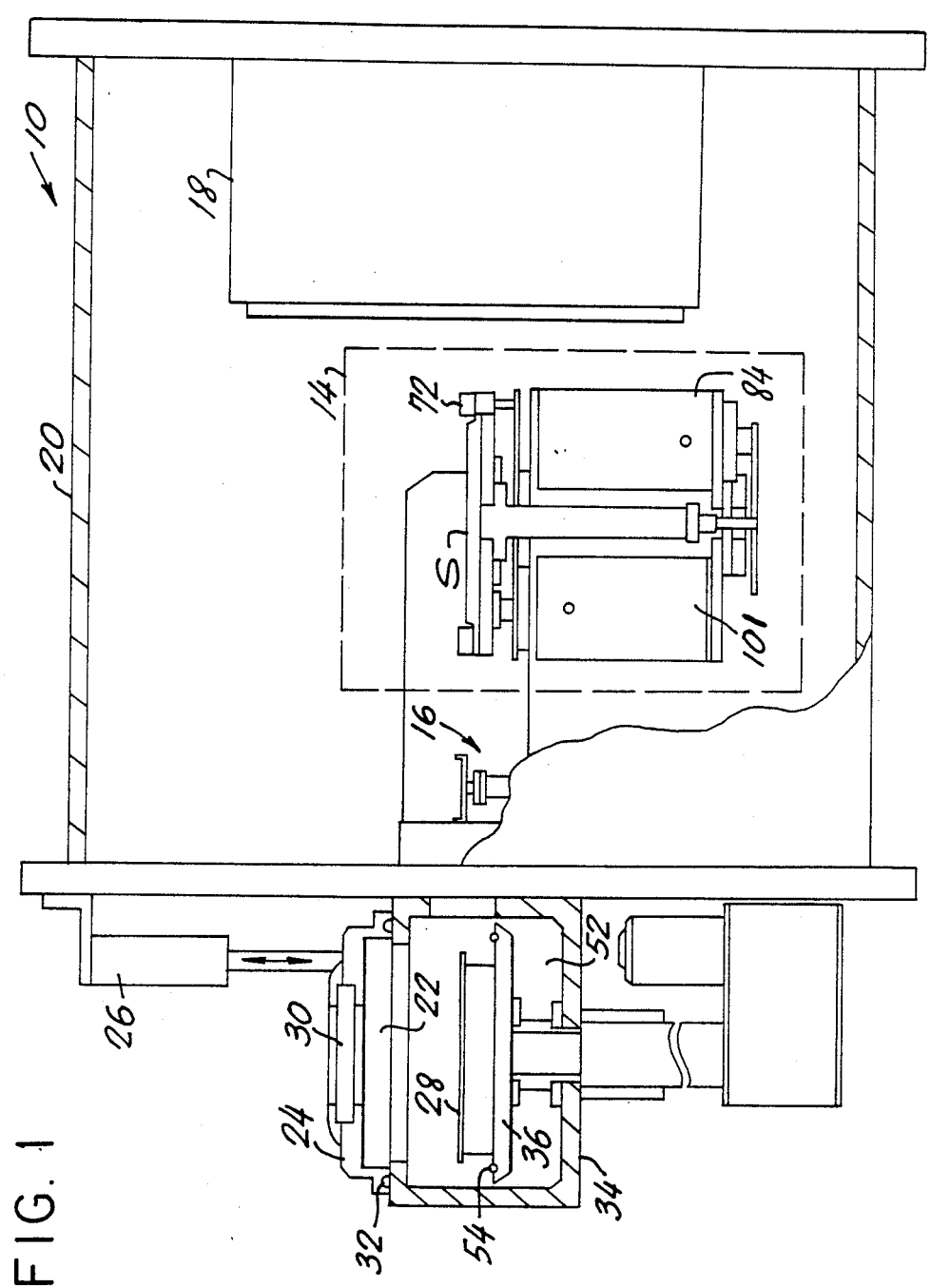
FIG. 1 is a longitudal cross-section of a substrate treating system, showing a substrate loading station, a substrate cooling fixture, an ion source, and a transport arm.
Figure 2:
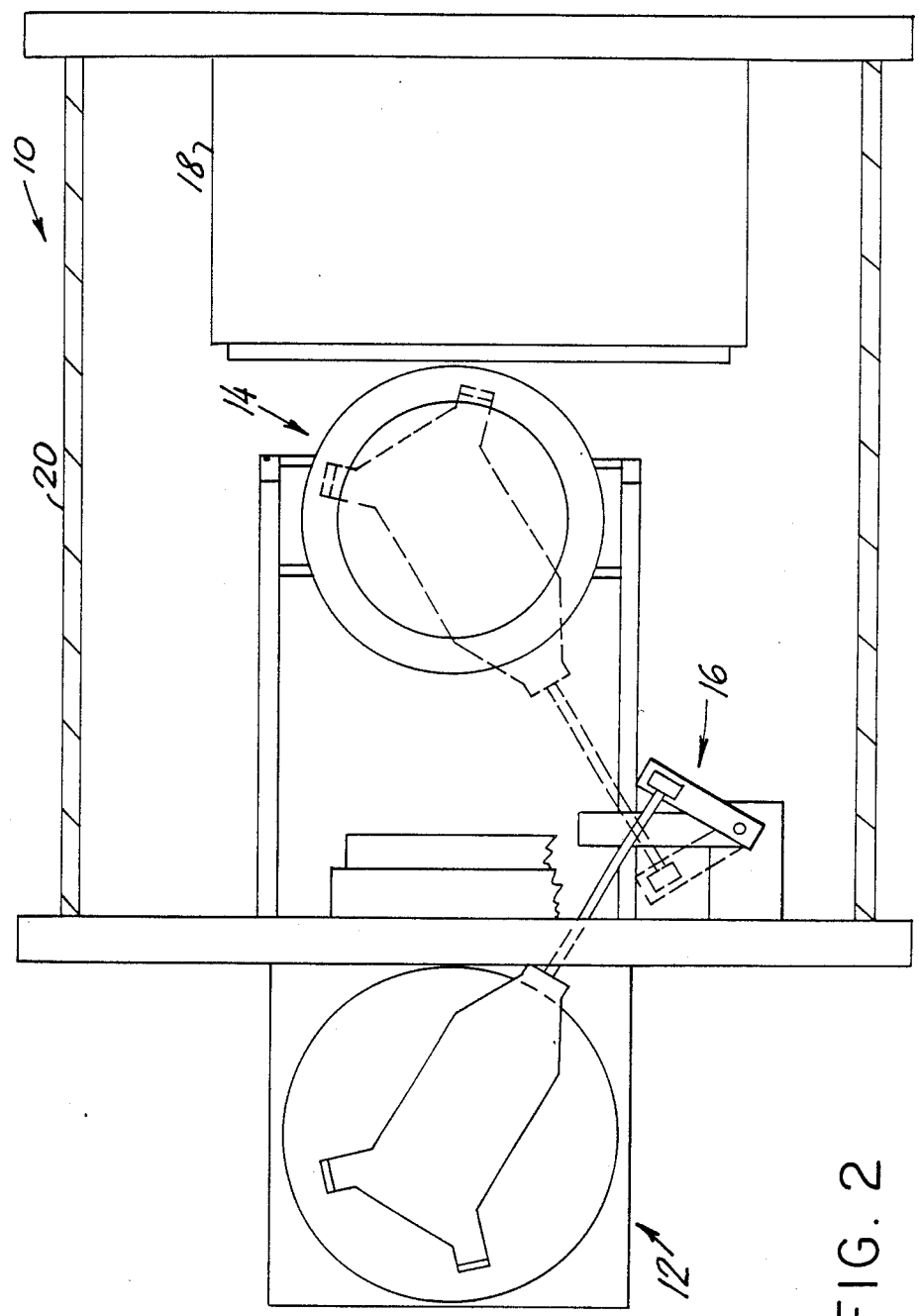
FIG. 2 is a top view of the treating system with the process chamber and loading station housing cut away to show the transfer arm in the load station position (solid line) and in the cooling fixture position (dotted line).

Referring to FIGS. 1 and 2, a substrate treating system 10 includes a loading station 12, cooling fixture 14, transport arm 16, ion source 18 and process chamber 20. A substrate S is loaded into the loading station 12 and moved by transfer arm 16 onto cooling fixture 14 within the process chamber 20. During treatment the process chamber is at substantially vacuum pressure (i.e. less than 0.0009 Torr). The ion source 18 directs an ion beam onto the substrate for processing the substrate (i.e. ion beam etching, reactive ion beam etching, chemically assisted ion beam etching, or other substrate treating process). The cooling fixture 14 cools the wafer during treatment by solid-to-solid conduction, free convection and forced convection.

Referring to FIG. 1, with the load-lock volume 22 at approximately atmospheric pressure, the loading station cover 24 is raised. In a manual system an operator inserts the substrate onto substrate holder 28. In an automatic system, a cassette to cassette automatic feeder or other automatic transport device is used to insert the substrate. The cover 24 is then lowered by an actuator 26. The substrate within the load station 12 can be seen through a view port 30 in the cover 24. With the cover 24 lowered, an O-ring 32 provides a seal between the load-lock volume 22 and the external environment.

The substrate holder 28 is connected to the load-lock platform 36 which may be moved up or down. In the up position a popet-type O-ring seal seals the load-lock volume 22 from the loading station chamber 52. The seal enables the load-lock volume 22 to be at atmospheric pressure, while the loading station chamber 52 is at substantially vacuum pressure. With the substrate inserted, the cover 24 closed, and the platform 36 in the up position, the load-lock volume 22 pressure is reduced to substantially less than atmospheric pressure. When at a pressure less than approximately 1 Torr, platform 36 lowers the substrate into the loading station chamber 52, thereby releasing the seal between the load-lock volume 22 and the chamber 52.

To change the position of the platform 36, a brake 38 is deactivated, allowing for rotation of a drive shaft 40. As the drive shaft rotates, a load-lock ball screw 42 moves the platform 36 up or down.

The drive shaft 40 at approximately atmospheric pressure moves the ball screw 42 at substantially vacuum pressure by transferring a rotational moment through a dynamic seal 44. The dynamic seal 44 includes two seal rings 46 housing an external O-ring 48 and an inner O-ring 50. The O-ring 48 acts as a seal and also acts as a cushion for absorbing eccentric motion of the shaft 40. The volume between the seal rings is differentially pumped. The inner O-ring 50 isolates the a vacuum pressure area from an atmospheric pressure area. Such a construction provides a low frictional torque between the shaft 40 and dynamic seal ring 50.

The loading station chamber 52 is open to the process chamber 20. With the platform 36 in the lower position, the transfer arm 16 having a home position within the process chamber 20 can access the substrate. Referring to FIG. 2, the transport arm 16 moves the substrate from the loading station 12 to the cooling fixture 14. Referring to FIGS. 5a and 5B the transport arm 16 includes a spatula-type member 60 connected to a four-bar slider linkage assembly. The linkage assembly includes a crank 62, slider block 64, based 66, and rod 68.

Figure 3:
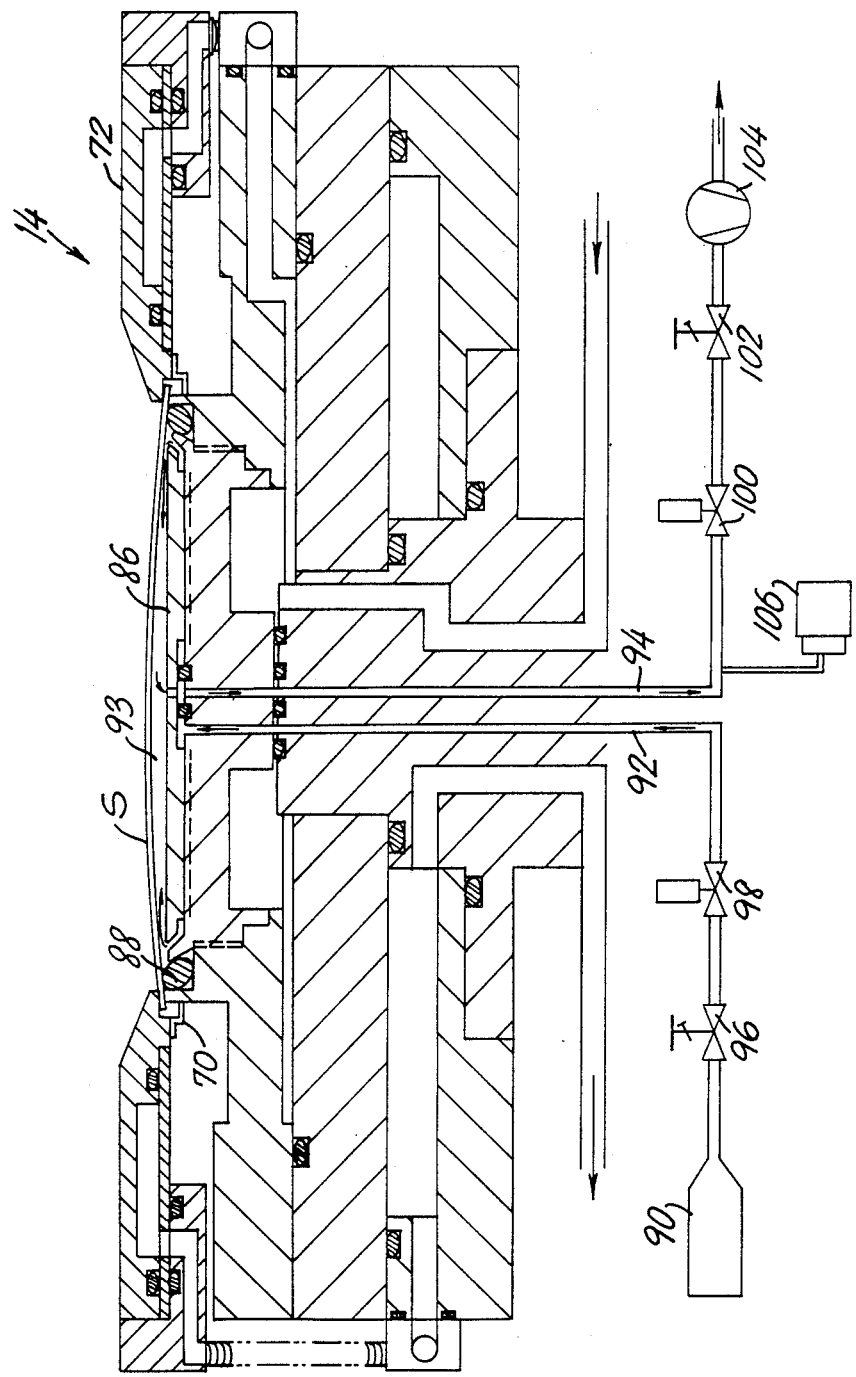
FIG. 3 is a cross-sectional view of the substrate cooling fixture with a substrate clamped to the fixture and gas flowing between the substrate and the fixture.
Figure 4:
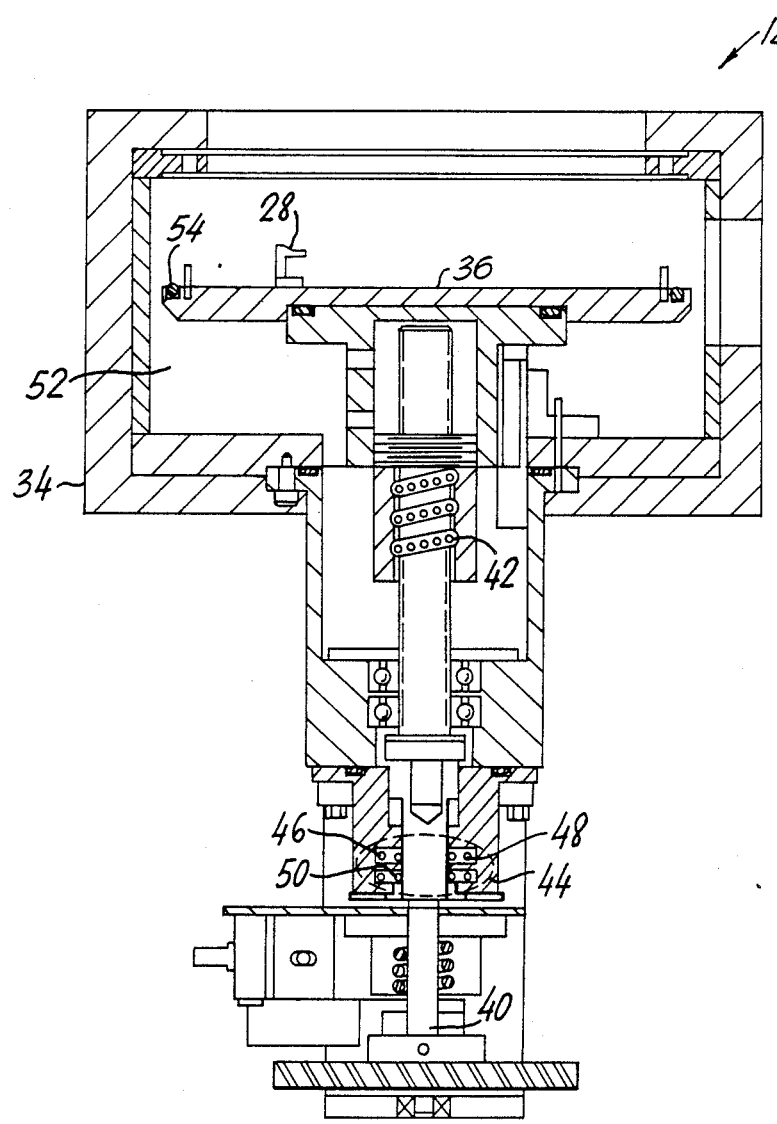
FIG. 4 is a cross-sectional view of the loading station, excluding the cover and cover actuator.

To access the substrate, the spatula 60 travels in a horizontal plane, parallel to the plane of the substrate and below such plane of the substrate into the loading chamber 52. When the spatula 60 is positioned below the substrate, the spatula 60 is raised vertically, thereby lifting the substrate off the substrate holder 28. The spatula then moves in a horizontal plane toward the cooling fixture 14 and loads the substrate into the fixture 14 between the substrate carrier 70 and the below the clamp 72. Referring to FIG. 3 the substrate carrier 70 and clamp 72 are shown in the down position. The clamp 72 may move vertically under the control of clamp actuator 84. When loading a substrate the two are in the up position, which has a vertical level above the plane of the substrate seat 86. The substrate moves freely between the carrier 70 and the clamp 72. The transfer arm 16 is then lowered allowing the substrate to come to rest on the substrate carrier 70.

The transfer arm moves the substrate to the fixture 14 without the need for clamping or securing the substrate to the spatula. The horizontal motion of the transfer arm 16 is accomplished with the four bar slider linkage assembly. In the preferred embodiment, the assembly uses pin or slider joints. The degrees of freedom of the linkage assembly is defined by the equation:

$$F = 3(n-1) - 2f$$

where,
n=number of links
f=number of joints

For 4 links and 4 joints, as illustrated, there is one degree of freedom (i.e. horizontal). Thus, referring to FIG. 5b a first rotary input shaft 74 results in a horizontal output motion. The first rotary input shaft 74 is geared through a miter bevel or other angle drive 76 to drive a linear couple 78. The linear couple 78 drives the crank 62 about the crank's pivot point. The crank rotation causes, via the rod 68 and slider block 64, a translation and rotation of the spatula 60 in the horizontal plane. The slider block 64 has a prismatic motion relative to the rod 68 and a pivot motion relative to the base 66. By providing both prismatic and pivot motion of the slider block 64, the spatula 60 may travel essentially a linear path between the loading station 12 and the cooling fixture 14 with a single rotary input.

A second rotary input shaft 80 drives a power screw or other rotary axial linear motion device 82 to provide a vertical motion of the linkage assembly and spatula. The linear couple 78 allows for verticle displacement of the linkage assembly without disturbing the crank 62 axis of rotation.

A conventional closed loop servo motor drive subsystem may be used to provide the first and second rotary shaft inputs under the control of a central computer. By using computer control, information on the position of the spatula 60 and substrate may be readily obtained. Other input control devices alternatively may be used to provide inputs to the first and second rotary input shafts.

After the substrate has been loaded into the cooling fixture 14, the transport arm 16 returns to a home position. At any time after the transport arm moves the wafer out of the vertical path of the load-lock platform 36 and prior to the start of substrate treatment, the platform 36 is raised to the upper position pressure-isolating the load lock volume 22 from the loading station chamber 52 and preventing exposure of the load-lock volume to the process gases.

After the substrate has been loaded onto the substrate carrier 70 at the cooling fixture 14, clamp actuator 84 is activated lowering the substrate clamp 72 and substrate carrier 70. Referring to FIG. 3, the substrate rests on the substrate seat 86, then is pressed to the seat 86. O-ring 88 (i.e. elostomer 40-70 durometer) or other vacuum gas seal near the periphery of the seat 86 provides a substantially vacuum tight seal between the substrate S and the seat 86. The substrate clamp 72 holds the substrate firmly to the seat 86 with an adjustable hold-down force which may vary depending on the material and thickness of the substrate. Examples of substrate materials are Silicon, GaAs, Ferrite, AlSiMag, and glass or other materials may also be used.

The size of the substrates may vary, for example, from 2 inches to 6 inches in diameter or from 1 inch by 1 inch to 6 inch by 6 inch square. The substrates, however, need not be a contiguous wafer-like body, but may be fragments mounted on a carrier. Substrate thickness may range, for example, from 0.01 inches to 4.0 millimeters. The size, material, and thickness, however, are not limited to the example ranges provided as the invention may be applied for a variety of size, material, and thickness ranges.

To cool the substrate during treatment, gas from a source 90 is flowed through a gas input channel 92 in the cooling fixture 14 and into and through the region 93 between the substrate S and the seat 86. The gas enters the region at the periphery of the seat within the confines of the O-ring 88, travels radially from the periphery to the center of the region, then exits through exit channel 94. The gas inlet and outlet can be reversed for various materials and thicknesses. In other embodiments the inlet and outlet positions may vary according to design.

Gas flow is controlled by a control device 96 such as a throttling valve, orifice, or mass flow controller. The gas pressure in the region between the substrate and the seat 86 will vary from approximately 10 Torr to 760 Torr and preferably from 20 Torr to 760 Torr depending on the thickness and material of the substrate. The gas travels from the source 90 through the control device 96, a shut-off valve 98, and the gas input channel 92 before entering the region between the substrate S and the seat 86. While passing through the input channel 92 the gas is cooled to approximately 10° C. by the fixture walls. The cooling fixture 14 has a circulating cooling fluid such as water for cooling the gas, although other cooling fluids may be used. The gas flows from the region 93 through the exit channel 94 and passes through another shut off valve 100 and control device 102. The gas flow is forced by a gas pump 104. A pressure meter 106 signifies the gas pressure.

While the gas flows radially from the outer diameter to the center of the region 93, the gas molecules absorb heat energy from (i) the back surface of the substrate and (ii) collisions with other gas molecules. This heat energy is transferred out of the region by the flowing of the gas molecules into the exit channel 94. Such heat transfer is a forced convection heat transfer.

By flowing the gas at a pressure high enough that the mean free path of the gas molecules is less than the distance between the substrate and the seat 86, molecular collisions occur in the direction perpendicular to the gas flow. As a result there also is a heat transfer from the back surface of the substrate to the seat 86 by free convection. The seat 86 is black anodized to increase its heat transfer coefficient. The pressure used is high enough to lift the substrate from the seat (i.e. so as to cause bowing).

Figure 6:
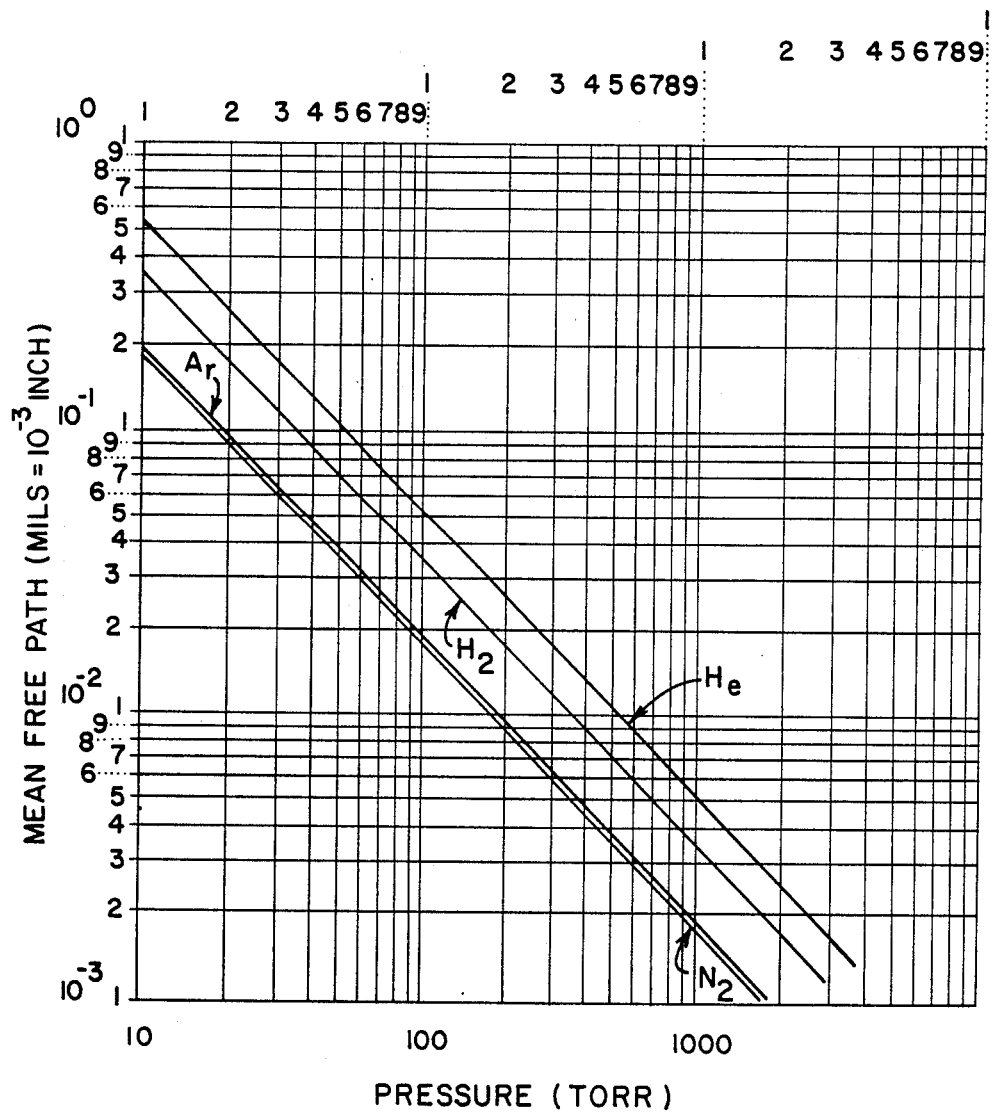
FIG. 6 is a log-log graph of pressure vs. free mean path of gas molecules for respective Nitrogen, Argon, Hydrogen, and Helium gasses.

FIG. 6 shows a graph of the mean free path vs pressure for Nitrogen, Argon, Hydrogen, and Helium gases, respectively. For example, the mean free path of Argon at a pressure of 25 Torr is approximately 0.000076 inches.

The cooling fixture 14 and clamp 72 are cooled via circulating cooling fluid. Heat energy from the substrate is transferred to the clamp by solid-to-solid conduction.

The cooling fixture 14 may be tilted and rotated during substrate treatment by a rotary actuator 101. For ion beam etching, the treating process time varies from one minute to more than two hours. After treatment the fixture 14 is positioned at a load position and shut-off valve 98 is closed. Gas pump 104 thereby pumps out the gas volume in channels 92 and 94 and in the region between the substrate and the seat. When the gas pressure monitor 106 senses a medium vacuum, the shut off valve 100 is closed. The degree of vacuum before ceasing the gas evacuation may vary. With both shut-off valves 98, 100 closed and the gas therebetween substantially evacuated, the clamp actuator 84 raises the substrate clamp 72. The substrate is thus lifted from the seat 86 by the substrate carrier 70 which is connected to the clamp 72. The transfer arm 16 then travels in a horizontal plane parallel to the substrate and below the plane of the substrate to the cooling fixture 14. When the spatula 60 is beneath the substrate, the link assembly and spatula are raised lifting the substrate off the substrate carrier.

To unload the substrate, the load lock volume 22 is pumped down to a substantially vacuum pressure after substrate treatment and prior to movement of the substrate from the area of the cooling fixture 14 to the loading station chamber 52. After the load-lock volume reaches substantially vacuum pressure, the load-lock platform 86 is lowered to the down position. While the platform 86 is in the down position, the transfer arm 16 moves the spatula with substrate into the loading station chamber 52. The linkage assembly and spatula then is lowered allowing the substrate to rest on the substrate holder 28. The transfer arm 16 then moves back to the home position.

The load lock platform 86 then moves to the up position pressure-isolating the load-lock volume from the loading station chamber 52. The load-lock volume is then vented up to approximately atmospheric pressure without producing significant turbulence. The cover actuator 26 then lifts the cover 24 and the operator or an automatic feeder device accesses the treated substrate.

While a preferred embodiment of this invention has been illustrated and described, the invention is capable of modification and addition without departing from its basic principles. Accordingly the invention is not intended to be limited to the exact embodiment illustrated. The scope of the invention is intended to be determined by reference to the claims and their equivalents in light of the prior art.

We claim:

1. A method for cooling a wafer-like article in a vacuum chamber, comprising the steps of:
   pressing the article to a cooling seat
   flowing gas under pressure into and through a region between the article and the seat to facilitate heat transfer from the article by forced convection; wherein the gas pressure in said region is high enough to facilitate heat transfer from the article to the seat by free convection; and
   cooling the article by solid-to-solid conduction between the article and the cooling clamp, wherein the cooling clamp is cooled by circulating cooling fluid.

2. The method of claim 1, wherein the gas is cooled by the cooling seat before flowing into the region between the article and the seat.

3. The method of claim 1, wherein the gas flows radially between the periphery of the seat and the center of the seat.

4. A method for cooling a wafer-like article in a vacuum chamber, comprising the steps of:
   pressing the article to a cooling seat;
   flowing gas under pressure into and through a region between the article and the seat to facilitate heat transfer from the article by forced convection; wherein the gas pressure in said region is high enough to facilitate heat transfer from the article to the seat by free convection; and
   wherein the gas pressure is high enough to cause bowing or lifting of the article.

5. The method of claim 4 further comprising the step of pumping the gas from the region between the article and the seat prior to a cessation of the pressing of the article to the seat.

6. The method of claim 4, wherein the gas pressure is substantially constant and is within a range between 10 Torr and 760 Torr, the substantially constant pressure within said range being determined by the material, size, and thickness of the article.

* * * * *

UNITED STATES PATENT AND TRADEMARK OFFICE
CERTIFICATE OF CORRECTION

PATENT NO. : 4,949,783
DATED : August 21, 1990
INVENTOR(S) : Emmanuel N. Lakios et al.

It is certified that error appears in the above-indentified patent and that said Letters Patent is hereby corrected as shown below:

Claim 1, col. 8, line 7, insert after "seat" --by a cooling clamp;--.

Signed and Sealed this

Twenty-ninth Day of March, 1994

Attest:

BRUCE LEHMAN

*Attesting Officer*   *Commissioner of Patents and Trademarks*